US012628604B2

(12) United States Patent
Colombeau et al.

(10) Patent No.: US 12,628,604 B2
(45) Date of Patent: May 12, 2026

(54) PROCESSING METHODS AND CLUSTER TOOLS FOR FORMING SEMICONDUCTOR DEVICES

(71) Applicant: Applied Materials, Inc., Santa Clara, CA (US)

(72) Inventors: Benjamin Colombeau, San Jose, CA (US); Balasubramanian Pranatharthiharan, San Jose, CA (US); Lequn Liu, San Jose, CA (US); Brian K. Kirkpatrick, Allen, TX (US)

(73) Assignee: Applied Materials, Inc., Santa Clara, CA (US)

( * ) Notice: Subject to any disclaimer, the term of this patent is extended or adjusted under 35 U.S.C. 154(b) by 196 days.

(21) Appl. No.: 18/225,799

(22) Filed: Jul. 25, 2023

(65) Prior Publication Data

US 2024/0038553 A1     Feb. 1, 2024

Related U.S. Application Data

(60) Provisional application No. 63/400,221, filed on Aug. 23, 2022, provisional application No. 63/392,258, filed on Jul. 26, 2022.

(51) Int. Cl.
H10P 72/00          (2026.01)
H10D 30/01          (2025.01)
                        (Continued)

(52) U.S. Cl.
CPC ....... H10P 72/0421 (2026.01); H10D 30/014 (2025.01); H10D 64/017 (2025.01);
                        (Continued)

(58) Field of Classification Search
None
See application file for complete search history.

(56) References Cited

U.S. PATENT DOCUMENTS

| | | | |
|---|---|---|---|
| 9,673,277 B2 | 6/2017 | Brand et al. | |
| 2020/0152493 A1 | 5/2020 | Colombeau et al. | |
| | (Continued) | | |

OTHER PUBLICATIONS

PCT International Search Report and Written Opinion in PCT/US2023/028690 dated Nov. 20, 2023, 10 pages.

*Primary Examiner* — Shamim Ahmed
(74) *Attorney, Agent, or Firm* — SERVILLA WHITNEY LLC

(57)     ABSTRACT

Semiconductor devices (e.g., GAA device structures) and processing methods and cluster tools for forming GAA device structures are described. The cluster tools for forming GAA device structures comprise a first etch chamber, a second etch chamber, and a third etch chamber. Each of the first etch chamber and the second etch chamber independently comprises a single-wafer chamber or an immersion chamber. One or more of the first etch chamber or the second etch chamber may be a wet etch chamber. In some embodiments, at least one of the first etch chamber, the second etch chamber, and the third etch chamber is a dry etch chamber. The cluster tool described herein advantageously reduces the number of cleaning processes, the total time between cleaning and processing operations, variations in time between processing and variation in sidewall loss compared to conventional cluster tools.

8 Claims, 9 Drawing Sheets

(51) Int. Cl.
    *H10D 64/01*       (2025.01)
    *H10D 30/67*       (2025.01)
    *H10D 62/10*       (2025.01)

(52) U.S. Cl.
    CPC ...... *H10P 72/0422* (2026.01); *H10P 72/0454*
        (2026.01); *H10P 72/0468* (2026.01); *H10D*
        *30/6735* (2025.01); *H10D 62/121* (2025.01)

(56) References Cited

U.S. PATENT DOCUMENTS

| | | |
|---|---|---|
| 2020/0152770 A1 | 5/2020 | Jang et al. |
| 2021/0098588 A1* | 4/2021 | Chung ................ H01L 21/3212 |
| 2021/0335657 A1* | 10/2021 | Lu .................... H01L 21/76837 |
| 2022/0037465 A1* | 2/2022 | Lin .................... H10D 84/0128 |
| 2022/0037529 A1 | 2/2022 | Kim et al. |
| 2022/0102511 A1* | 3/2022 | Hsiung ............... H01L 23/5226 |
| 2022/0123123 A1 | 4/2022 | Kim et al. |
| 2022/0230908 A1* | 7/2022 | Hsiao ................. H10D 84/0151 |

\* cited by examiner

100

500

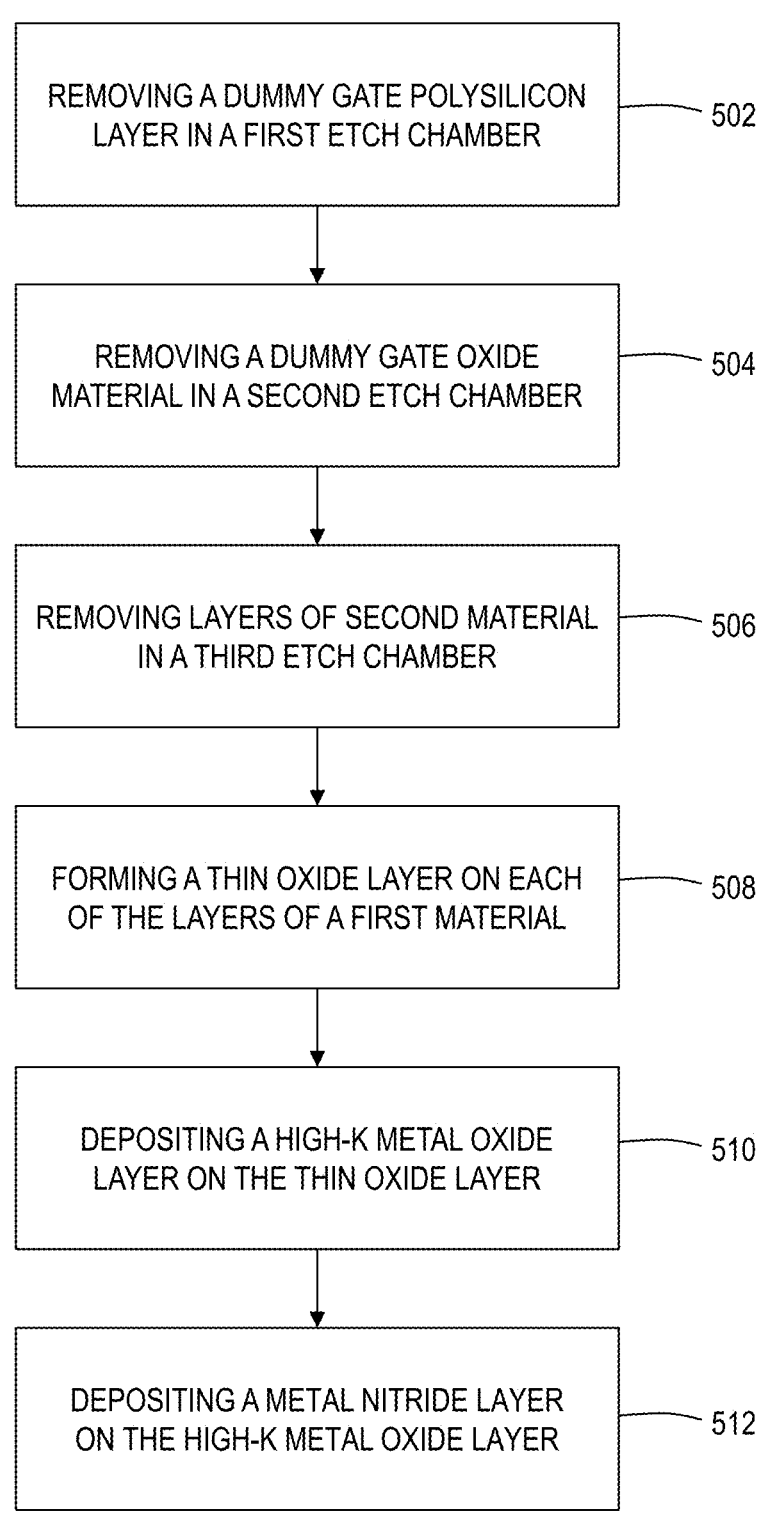

REMOVING A DUMMY GATE POLYSILICON LAYER IN A FIRST ETCH CHAMBER — 502

REMOVING A DUMMY GATE OXIDE MATERIAL IN A SECOND ETCH CHAMBER — 504

REMOVING LAYERS OF SECOND MATERIAL IN A THIRD ETCH CHAMBER — 506

FORMING A THIN OXIDE LAYER ON EACH OF THE LAYERS OF A FIRST MATERIAL — 508

DEPOSITING A HIGH-K METAL OXIDE LAYER ON THE THIN OXIDE LAYER — 510

DEPOSITING A METAL NITRIDE LAYER ON THE HIGH-K METAL OXIDE LAYER — 512

FIG. 9

PROCESSING METHODS AND CLUSTER TOOLS FOR FORMING SEMICONDUCTOR DEVICES

CROSS-REFERENCE TO RELATED APPLICATIONS

This application claims priority to U.S. Provisional Application No. 63/400,221, filed Aug. 23, 2022, and U.S. Provisional Application No. 63/392,258, filed Jul. 26, 2022, the entire disclosures of which are hereby incorporated by reference herein.

TECHNICAL FIELD

Embodiments of the present disclosure generally relate to semiconductor devices and, more particularly, to gate-all-around (GAA) device structures and processing methods and cluster tools for forming GAA device structures.

BACKGROUND

The transistor is a key component of most integrated circuits. Since the drive current, and therefore speed, of a transistor is proportional to the gate width of the transistor, faster transistors generally require larger gate width. Thus, there is a trade-off between transistor size and speed, and "fin" field-effect transistors (finFETs) have been developed to address the conflicting goals of a transistor having maximum drive current and minimum size. FinFETs are characterized by a fin-shaped channel region that greatly increases the size of the transistor without significantly increasing the footprint of the transistor, and are now being applied in many integrated circuits. However, finFETs have their own drawbacks.

As the feature sizes of transistor devices continue to shrink to achieve greater circuit density and higher performance, there is a need to improve transistor device structure to improve electrostatic coupling and reduce negative effects such as parasitic capacitance and off-state leakage. Examples of transistor device structures include a planar structure, a fin field effect transistor (FinFET) structure, and a gate-all-around (GAA) device structure. The GAA device structure, for example, includes several lattice matched channels suspended in a stacked configuration and connected by source/drain regions. The GAA device structure provides good electrostatic control and can find broad adoption in complementary metal oxide semiconductor (CMOS) wafer manufacturing.

Logic gate performance is related to the characteristics of the materials used as well as the thickness and area of the structural layers. However, as some gate characteristics are adjusted to accommodate device scaling, challenges arise.

For example, each cleaning step and each etch step of GAA device structure formation results in loss of spacer materials (i.e., inner, outer, and sidewall spacer materials). Typical processes for forming GAA device structures include removing a wafer from a processing tool, loading the wafers into a front opening unified pod (FOUP), using an OverHead Track (OHT) system to move the FOUP to a Stocker (stores the FOUP), using an OHT to move the FOUP back to the next processing tool, and loading the wafers into another processing tool (i.e., remove-load-move-move back-reload sequence). Typically, a cleaning process is performed before each step of the remove-load-move-move back-reload sequence performed in conventional cluster tools. As a result of the cleaning process performed before each step of the remove-load-move-move back-reload sequence, variation in the sidewall material is induced. Depositing additional sidewall material prior to cleaning and/or etching in attempt to compensate for the absolute value of the sidewall loss and variation in sidewall loss may negatively impact semiconductor device performance.

Therefore, there is a need for improved methods and cluster tools for reducing the absolute value of the sidewall loss and the variation in sidewall loss in semiconductor device (e.g., GAA device structure) formation.

SUMMARY

One or more embodiments of the disclosure are directed a cluster tool for forming a gate-all-around (GAA) device. The cluster tool comprises a central transfer station configured to receive a substrate and to transfer the substrate to and from a plurality of processing chambers each independently connected to the central transfer station. The plurality of processing chambers comprises a first etch chamber configured to remove a dummy gate polysilicon layer from a top surface of a plurality of dummy gates. The plurality of dummy gates is formed from a substrate surface over a plurality of fins extending along a first direction to provide a plurality of trenches extending along a second direction crossing the first direction to expose portions of the plurality of fins so that portions of fins on the substrate surface are covered by the dummy gates and portions of the fins are exposed. The fins comprise alternating layers of a first material and a second material. The plurality of processing chambers comprises a second etch chamber configured to remove a dummy gate oxide material deposited on the plurality of fins and a third etch chamber configured to remove the layers of second material between adjacent layers of the first material.

Additional embodiments of the disclosure are directed to a processing method. The processing method comprises removing a dummy gate polysilicon layer from a top surface of a plurality of dummy gates in a first etch chamber. The plurality of dummy gates is formed from a substrate surface over a plurality of fins extending along a first direction to provide a plurality of trenches extending along a second direction crossing the first direction to expose portions of the plurality of fins so that portions of fins on the substrate surface are covered by the dummy gates and portions of the fins are exposed. The fins comprise alternating layers of a first material and a second material. The processing method further comprises removing a dummy gate oxide material deposited on the plurality of fins in a second etch chamber and removing the layers of second material between adjacent layers of the first material in a third etch chamber.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

3

Figure 8:
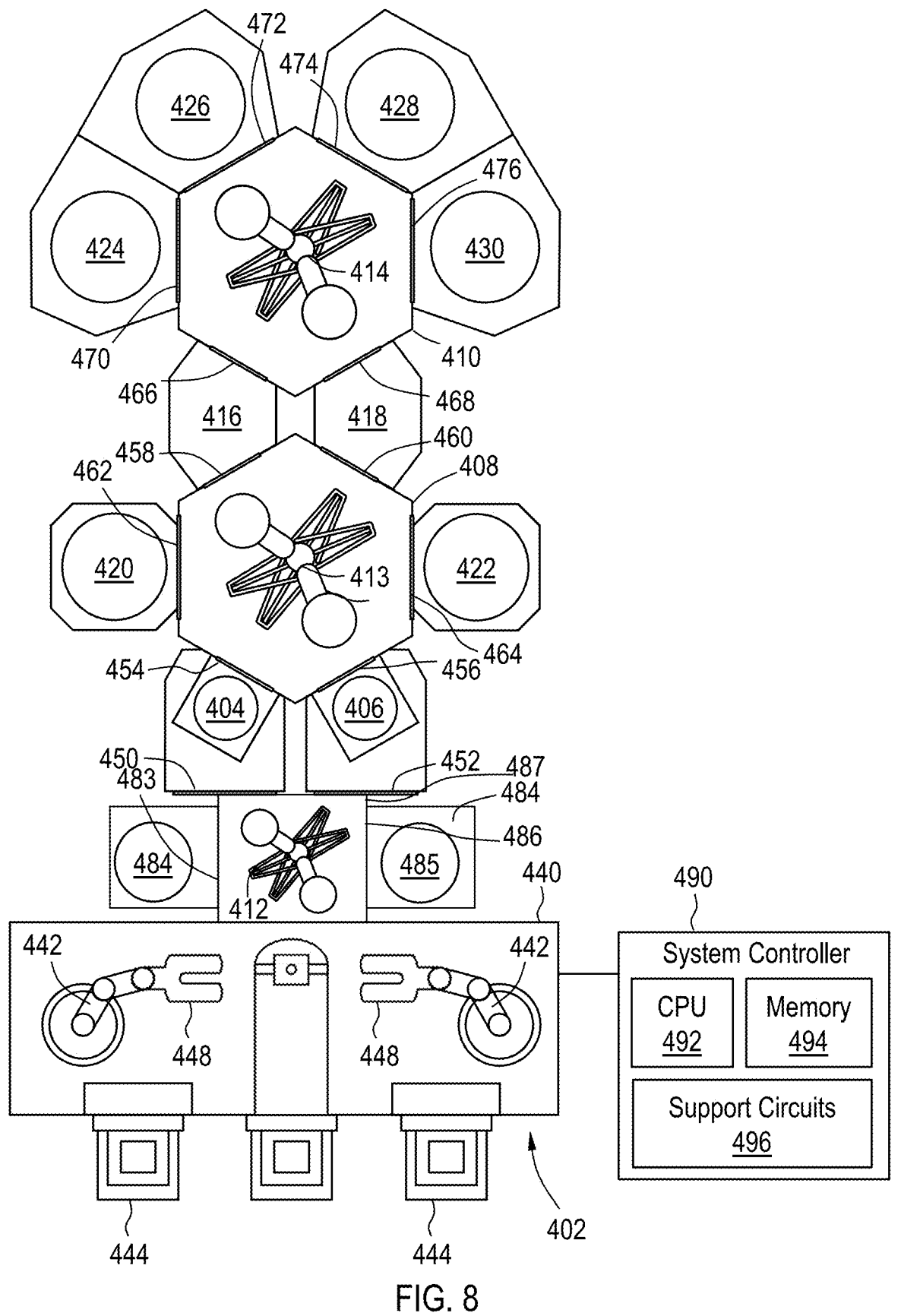

FIG. 8 illustrates a schematic top-view diagram of an example of a multi-chamber processing system according to one or more embodiments; and FIG. 9 illustrates a process flow diagram of a processing method according to one or more embodiments.

DETAILED DESCRIPTION

Before describing several exemplary embodiments of the disclosure, it is to be understood that the disclosure is not limited to the details of construction or process steps set forth in the following description. The disclosure is capable of other embodiments and of being practiced or being carried out in various ways.

As used in this specification and the appended claims, the term "substrate" refers to a surface, or portion of a surface, upon which a process acts. It will also be understood by those skilled in the art that reference to a substrate can also refer to only a portion of the substrate unless the context clearly indicates otherwise. Additionally, reference to depositing and/or forming on a substrate can mean both a bare substrate and a substrate with one or more films or features deposited or formed thereon.

A "substrate" as used herein, refers to any substrate or material surface formed on a substrate upon which film processing is performed during a fabrication process. For example, a substrate surface on which processing can be performed include materials such as silicon, silicon oxide, strained silicon, silicon on insulator (SOI), carbon doped silicon oxides, amorphous silicon, doped silicon, germanium, gallium arsenide, glass, sapphire, and any other materials such as metals, metal nitrides, metal alloys, and other conductive materials, depending on the application. Substrates include, without limitation, semiconductor wafers. Substrates may be exposed to a pretreatment process to polish, etch, clean, reduce, oxidize, hydroxylate, anneal and/or bake the substrate surface. In addition to film processing directly on the surface of the substrate itself, in the present disclosure, any of the film processing steps disclosed may also be performed on an under-layer formed on the substrate as disclosed in more detail below, and the term "substrate surface" is intended to include such under-layer as the context indicates. Thus, for example, where a film/layer or partial film/layer has been deposited onto a substrate surface, the exposed surface of the newly deposited film/layer becomes the substrate surface.

Transistors are circuit components or elements that are often formed on semiconductor devices. Depending upon the circuit design, in addition to capacitors, inductors, resistors, diodes, conductive lines, or other elements, transistors are formed on a semiconductor device. Generally, a transistor includes a gate formed between source and drain regions. In one or more embodiments, the source and drain regions include a doped region of a substrate and exhibit a doping profile suitable for a particular application. The gate is positioned over the channel region and includes a gate dielectric interposed between a gate electrode and the channel region in the substrate.

As used herein, the term "field effect transistor" or "FET" refers to a transistor that uses an electric field to control the electrical behavior of the device. Enhancement mode field effect transistors generally display very high input impedance at low temperatures. The conductivity between the drain and source terminals is controlled by an electric field in the device, which is generated by a voltage difference between the body and the gate of the device. The FET's three terminals are source (S), through which the carriers enter the channel; drain (D), through which the carriers leave the channel; and gate (G), the terminal that modulates the channel conductivity. Conventionally, current entering the channel at the source (S) is designated $I_S$ and current entering the channel at the drain (D) is designated $I_D$. Drain-to-source voltage is designated $V_{DS}$. By applying voltage to gate (G), the current entering the channel at the drain (i.e., $I_D$) can be controlled.

The metal-oxide-semiconductor field-effect transistor (MOSFET) is a type of field-effect transistor (FET). It has an insulated gate, whose voltage determines the conductivity of the device. This ability to change conductivity with the amount of applied voltage is used for amplifying or switching electronic signals. A MOSFET is based on the modulation of charge concentration by a metal-oxide-semiconductor (MOS) capacitance between a body electrode and a gate electrode located above the body and insulated from all other device regions by a gate dielectric layer. Compared to the MOS capacitor, the MOSFET includes two additional terminals (source and drain), each connected to individual highly doped regions that are separated by the body region. These regions can be either p or n type, but they are both be of the same type, and of opposite type to the body region. The source and drain (unlike the body) are highly doped as signified by a "+" sign after the type of doping.

If the MOSFET is an n-channel or nMOS FET, then the source and drain are n+ regions and the body is a p region. If the MOSFET is a p-channel or pMOS FET, then the source and drain are p+ regions and the body is a n region. The source is so named because it is the source of the charge carriers (electrons for n-channel, holes for p-channel) that flow through the channel; similarly, the drain is where the charge carriers leave the channel.

As used herein, the term "fin field-effect transistor (FinFET)" refers to a MOSFET transistor built on a substrate where the gate is placed on two or three sides of the channel, forming a double- or triple-gate structure. FinFET devices have been given the generic name FinFETs because the channel region forms a "fin" on the substrate. FinFET devices have fast switching times and high current density.

As used herein, the term "gate-all-around (GAA)," is used to refer to an electronic device, e.g., a transistor, in which the gate material surrounds the channel region on all sides. The channel region of a GAA transistor may include nano-wires or nano-slabs, bar-shaped channels, or other suitable channel configurations known to one of skill in the art.

As used herein, the term "nanowire" refers to a nanostructure, with a diameter on the order of a nanometer ($10^{-9}$ meters). Nanowires can also be defined as the ratio of the length to width being greater than 1000. Alternatively, nanowires can be defined as structures having a thickness or diameter constrained to tens of nanometers or less and an unconstrained length. Nanowires are used in transistors and some laser applications, and, in one or more embodiments, are made of semiconducting materials, metallic materials, insulating materials, superconducting materials, or molecular materials. In one or more embodiments, nanowires are used in transistors for logic CPU, GPU, MPU, and volatile (e.g., DRAM) and non-volatile (e.g., NAND) devices.

One or more embodiments of the disclosure are described with reference to the Figures. FIGS. 1-7 depict the stages of fabrication of semiconductor structures in accordance with some embodiments of the disclosure.

Figure 1:
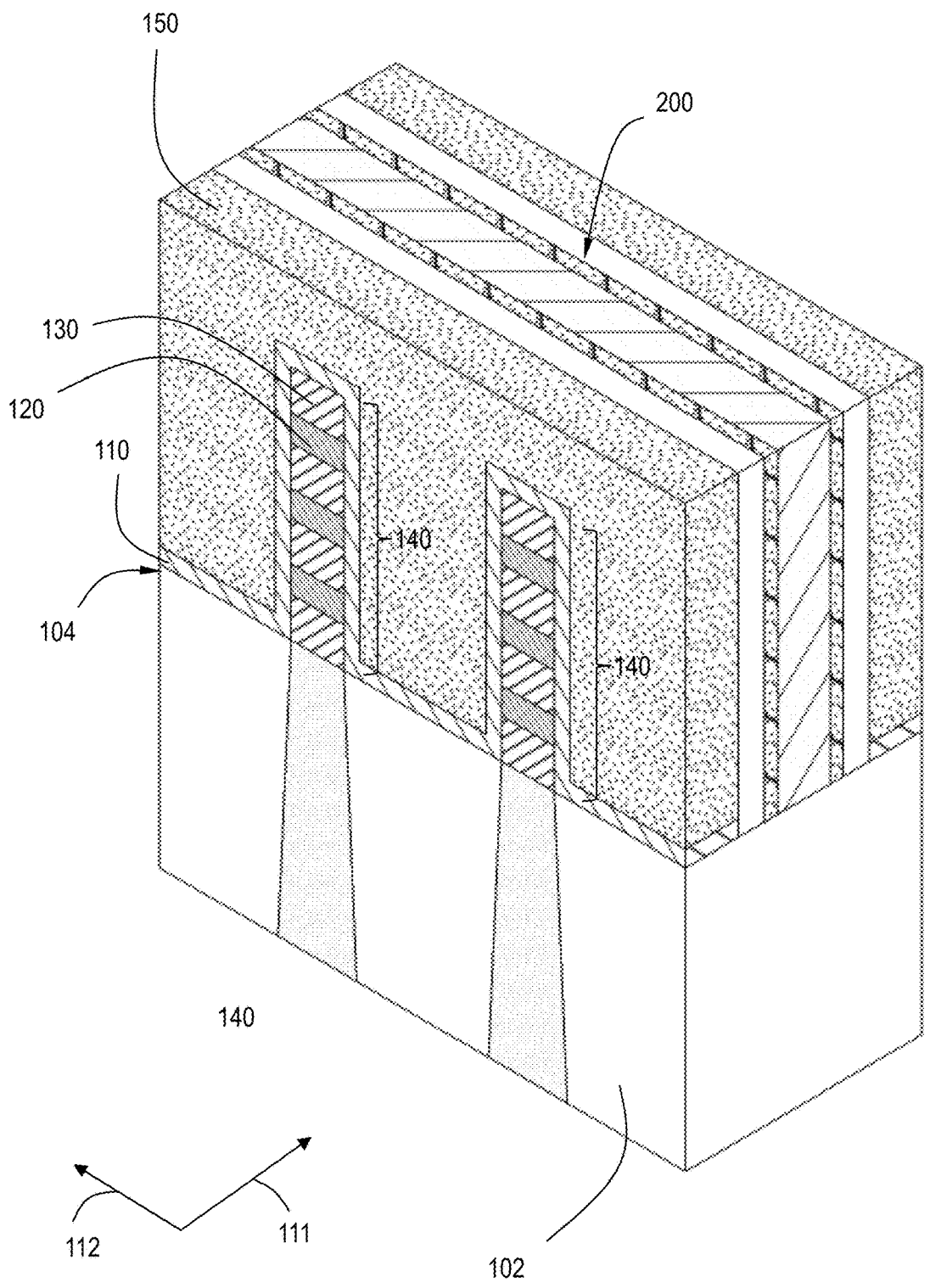
FIGS. 1-7 illustrate cross-sectional schematic views of a portion of a semiconductor device according to one or more embodiments.

FIG. 1 illustrates a substrate 102 having a top surface 104. In some embodiments, the substrate 102 may be a bulk semiconductor substrate. As used herein, the term "bulk semiconductor substrate" refers to a substrate in which the entirety of the substrate is comprised of a semiconductor material. The bulk semiconductor substrate may comprise any suitable semiconducting material and/or combinations of semiconducting materials for forming a semiconductor structure. For example, the semiconducting layer may comprise one or more materials such as crystalline silicon (e.g., Si<100> or Si<111>), silicon oxide, strained silicon, silicon germanium, doped or undoped polysilicon, doped or undoped silicon wafers, patterned or non-patterned wafers, doped silicon, germanium, gallium arsenide, or other suitable semiconducting materials. In some embodiments, the semiconductor material is silicon (Si). In one or more embodiments, the semiconductor substrate 102 comprises a semiconductor material, e.g., silicon (Si), carbon (C), germanium (Ge), silicon germanium (SiGe), germanium tin (GeSn), other semiconductor materials, or any combination thereof. In one or more embodiments, the substrate 102 comprises one or more of silicon (Si), germanium (Ge), gallium (Ga), arsenic (As), or phosphorus (P). Although a few examples of materials from which the substrate may be formed are described herein, any material that may serve as a foundation upon which passive and active electronic devices (e.g., transistors, memories, capacitors, inductors, resistors, switches, integrated circuits, amplifiers, optoelectronic devices, or any other electronic devices) may be built falls within the spirit and scope of the present disclosure.

In some embodiments, the semiconductor material may be a doped material, such as n-doped silicon (n-Si), or p-doped silicon (p-Si). In some embodiments, the substrate may be doped using any suitable process such as an ion implantation process.

As used herein, the term "n-type" refers to semiconductors that are created by doping an intrinsic semiconductor with an electron donor element during manufacture. The term n-type comes from the negative charge of the electron. In n-type semiconductors, electrons are the majority carriers and holes are the minority carriers. As used herein, the term "p-type" refers to the positive charge of a well (or hole). As opposed to n-type semiconductors, p-type semiconductors have a larger hole concentration than electron concentration. In p-type semiconductors, holes are the majority carriers and electrons are the minority carriers. In one or more embodiments, the dopant is selected from one or more of boron (B), gallium (Ga), phosphorus (P), arsenic (As), other semiconductor dopants, or combinations thereof.

For example, a device structure 100 shown in FIG. 1 comprises a plurality of dummy gates 200 formed on the substrate surface 104 over a plurality of fins 140 extending along a first direction 111. In the GAA device structure, the plurality of fins 140 comprises alternating layers of a first material 120 (also referred to as a channel layer) and a second material 130 (also referred to as a sacrificial layer). In some embodiments, the plurality of layers of first material 120 and the corresponding plurality of layers of second material 130 comprise in range of from 2 pairs to 250 pairs, including in a range of from 3 pairs to 100 pairs of lattice matched materials.

In some embodiments of the device structure shown in FIG. 1, the first material 120 (i.e., the plurality of channel layers) comprises silicon (Si) and the second material 130 (i.e., the corresponding plurality of sacrificial layers) comprises silicon germanium (SiGe). In some embodiments, the first material 120 (i.e., the plurality of channel layers) comprises silicon germanium (SiGe) and the second material 130 (i.e., the corresponding plurality of sacrificial layers) comprises silicon (Si).

In some embodiments, the thickness of the first material 120 and the thickness of the second material 130 are different. In one or more embodiments, the thicknesses of the channel layers (first material 120) and sacrificial layers (second material 130) are in the range of from about 2 nm to about 50 nm, in the range of from about 3 nm to about 20 nm, or in a range of from about 2 nm to about 15 nm. In some embodiments, the average thickness of the sacrificial layers is within 0.5 to 2 times the average thickness of the channel layers.

For descriptive purposes, the illustrated embodiment shows two fins 140. However, the skilled artisan will recognize that there are often more than two fins 140. In one or more embodiments, the GAA device structure has three fins 140, each split by a trench 105; however, the skilled artisan will recognize that there can be more or less than three fins 140. The fins 140 have a length extending along a first direction (also referred to as the X-direction), a width extending along a second direction (also referred to as the Y-direction), and a height extending along a third direction (also referred to as the Z-direction). The use of the term "horizontal" refers to the plane formed by the first direction and the second direction (also referred to as the X-Y plane). The use of the term "vertical" means the along the third direction. The terms "horizontal" and "vertical" are used to illustrate relative directionality and should not be interpreted as any particular relationship relative to the gravitational pull. In some embodiments, the number of fins 140 is a multiple of three.

Figure 2:
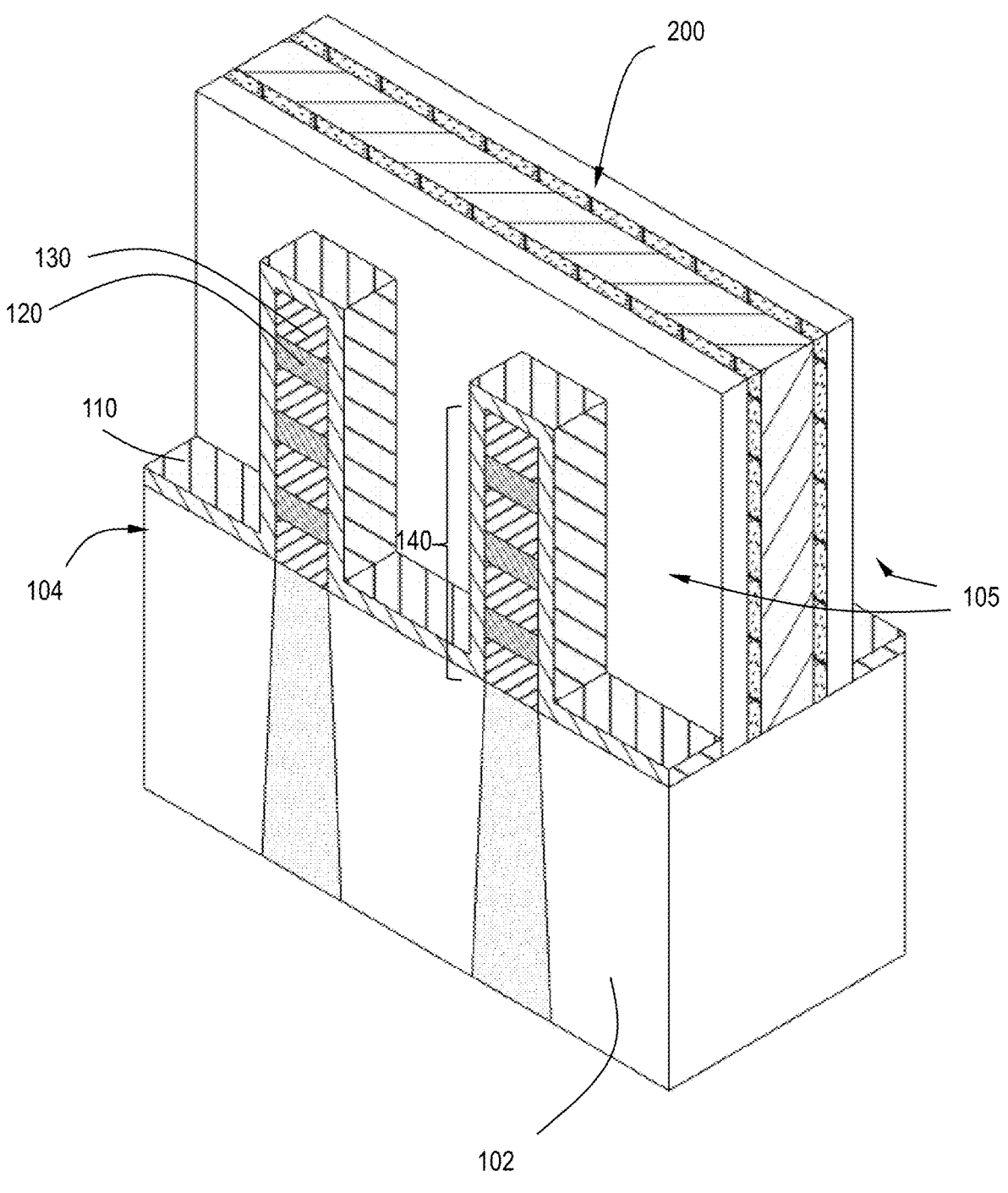
Figure 3:
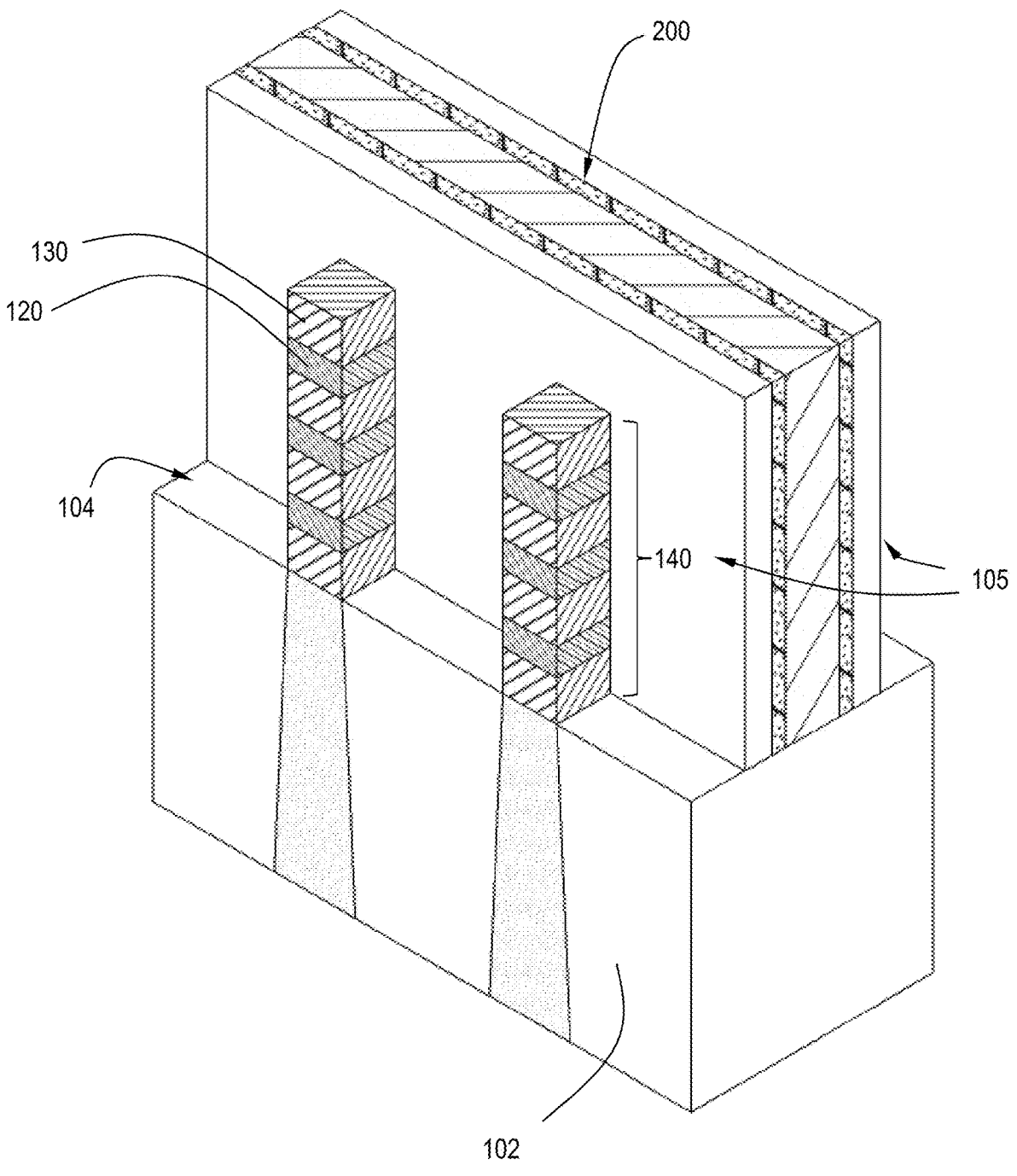
Figure 4:
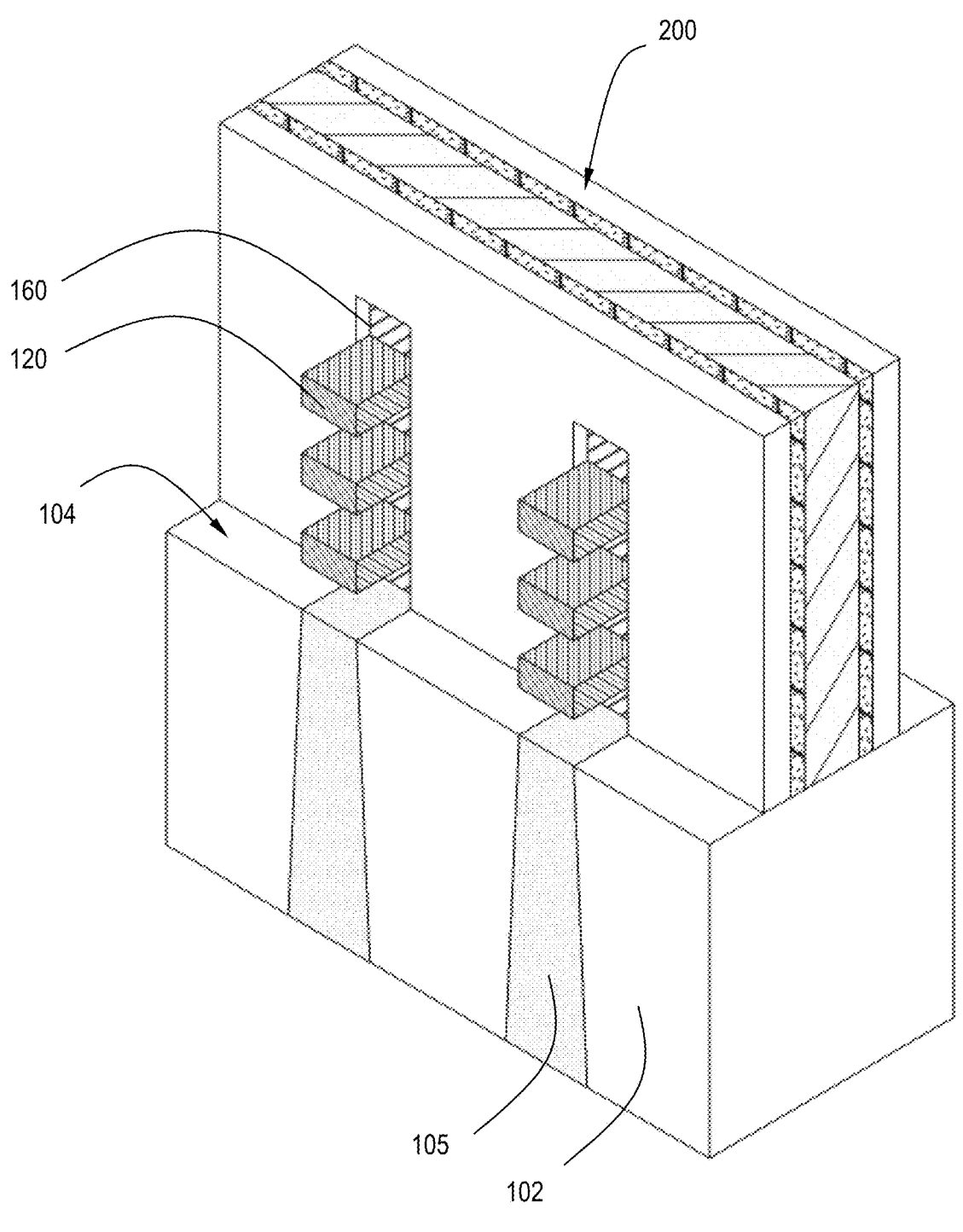

FIGS. 2-4 depict the stages of fabrication of semiconductor structures in accordance with some embodiments of the disclosure. FIG. 8 illustrates a schematic top-view diagram of an example of a multi-chamber processing system (i.e., cluster tool 400) according to embodiments of the present disclosure. The stages of fabrication of semiconductor structures illustrated in FIGS. 2-4 may be performed in the cluster tool 400 shown in FIG. 8. FIG. 9 illustrates a process flow diagram of a processing method 500. The processing method 500 may be used in the cluster tool 400 illustrated in FIG. 8 to the semiconductor structures illustrated in FIGS. 2-4, including, for example, a GAA device structure.

The processing method 500 comprises removing a dummy gate polysilicon 150 layer to provide a plurality of trenches 105 extending along a second direction 112 crossing the first direction 111 to expose portions of the plurality of fins 140 covered by a dummy gate oxide material 110. In some embodiments, removing the dummy gate polysilicon 150 is performed in a first etch chamber (operation 502). In some embodiments, removing the dummy gate polysilicon 150 is performed by a dry etch process in a dry etch chamber. In some embodiments, removing the dummy gate polysilicon 150 is performed by a wet etch process in an atmospheric pressure wet etch chamber. In some embodiments, use of an atmospheric wet etch chamber is performed using a suitably connected load lock chamber that allows for controlled timing to maintain consistency in the wet etch results.

At operation 504, as shown in FIG. 3, the processing method 500 comprises removing the dummy gate oxide material 110 exposed in the trenches 105 when the dummy gate polysilicon 150 layer was removed. In some embodiments, removing the dummy gate oxide material 110 is performed by a dry etch process in a dry etch chamber. In some embodiments, removing the dummy gate oxide material 110 is performed by a wet etch process in an atmospheric pressure wet etch chamber.

FIG. 4 shows the electronic device after operation 506 of method 500. At operation 506, the layers of second material 130 are removed to expose the nanowires of the first material 120. In some embodiments, removing the second material 130 occurs in a wet etch process in an atmospheric pressure wet etch chamber.

Removing the second material 130 exposes the inner spacer material 160. In some embodiments, the inner spacer material comprises a low-κ dielectric material. The inner spacer material may include any suitable insulating materials known in the art, for example, silicon nitride, silicon oxide, silicon oxynitride, silicon carbide, silicon carbonitride, or the like. In some embodiments, the inner spacer material has a width in the range of 1 to 10 nm, or in the range of 2 to 8 nm, or in the range of 3 to 7 nm, or in the range of 4 to 5 nm.

Each of the processing chambers described herein may be described with reference to the cluster tool 400 in FIG. 8. The processing chamber comprising an etch chamber may include any etching process known to the skilled artisan. In some embodiments, the etch chamber may include plasma processes. In some embodiments, the etch chamber may include processes that are substantially free of plasma or without plasma. As used in this manner, "substantially free of plasma" means that the process uses, at most, an amount of plasma that does not chemically alter the properties of a wafer or any layers thereon.

Despite conventional processing chambers seeking to reduce time delay, delays of hours are inevitable in conventional technologies based on batch processing in which multiple substrates are processed at each tool before being transferred to a subsequent tool. Each time a substrate is stored before a subsequent processing step, a cleaning step is required. Each cleaning step introduces variations in the thickness of the device's sidewalls and loss of sidewall material. Consequently, ex situ wet cleaning is incapable of producing structures having reduced absolute variation and/or variation in sidewall loss, as well as contaminant levels according to the embodiments of the present disclosure.

To reduce the overall variability in the sidewall thickness and to minimize loss, an in situ process including at least one wet etch process has been developed. In some embodiments, each of the first etch chamber and the second etch chamber independently comprises a single-wafer chamber or an immersion chamber. In some embodiments, one or more of the first etch chamber or the second etch chamber is a wet etch chamber.

In some embodiments, one or more of the first etch chamber or the second etch chamber comprises a single-wafer wet etch chamber that is maintained at atmospheric pressure. As used in this manner, atmospheric pressure includes pressures in the range of 500 torr to 1000 torr.

Dry etch and wet etch chambers for use with embodiments of the disclosure can be single wafer chambers, batch processing chambers, or a stack of single-wafer chambers. Wet etch chambers include single wafer or immersion chambers. In some embodiments, the first etch chamber comprises a single-wafer wet etch chamber. In some embodiments, the second etch chamber comprising a single-wafer wet etch chamber. In some embodiments, one or more of the first etch chamber or the second etch chamber comprises a plurality of stacked single-wafer wet etch chambers.

When transferring the substrate to or from a wet etch chamber, a vacuum break occurs. For example, if the first etch chamber is a dry etch chamber and the second etch chamber is a wet etch chamber, a vacuum break occurs when transferring the substrate from the first etch chamber to the second etch chamber. Without intending to be bound by theory, it is believed that the vacuum break in the cluster tool between transferring the substrate, which typically includes a cleaning process performed therebetween, results in variation in sidewall loss.

Each single-wafer wet etch chamber may be fluidly coupled with a plurality of chemical delivery systems. In some embodiments, each single-wafer wet etch chamber is coupled with a different chemistry delivery system. In some embodiments, the plurality of single-wafer wet etch chambers may be vertically stacked on one another. In some embodiments, the plurality of single-wafer wet etch chambers may allow individual processes to be performed in each chamber or may allow multiple substrates to be processed simultaneously. In some embodiments, the plurality of single-wafer wet etch chambers includes 2, 3, 4, 5, or 6 single-wafer wet etch chambers vertically stacked on one another. The plurality of single-wafer wet etch chambers may be stacked on one another in a manner such that the plurality of single-wafer wet etch chambers will be accessible to any of the transfer robots 412, 413, 414. Additionally, because wet clean chambers may be accessed at an angle, as opposed to only by straight-on delivery, the chambers may be readily be accessed by the different transfer robots 412, 413, 414 as previously described, without requiring additional modification of the transfer robots 412, 413, 414.

In embodiments when the first etch chamber is a wet etch chamber, removing the dummy gate polysilicon layer from the top surface of the plurality of dummy gates comprises one or more of: cleaning the substrate surface with a first chemistry including fluorine; cleaning the substrate surface with a second chemistry comprising ammonium a strong base; or cleaning the substrate surface with a third chemistry comprising chlorine.

In some embodiments, operation 502 cleans the substrate surface with a first chemistry that includes any suitable fluorine-containing compound. Suitable fluorine-containing etchants include, but are not limited to, hydrofluoric acid (HF) or a dilute HF 1:100 etch solution. In some embodiments, operation 504 cleans the substrate surface with the second chemistry which includes a strong base. Suitable strong bases include, but are not limited to, ammonium hydroxide ($NH_4OH$), tetramethylammonium hydroxide, or tetraethylammonium hydroxide. In some embodiments, operation 506 cleans the substrate surface with the third chemistry which includes any suitable chlorine-containing compound. Suitable chlorine-containing etchants include, but are not limited to, hydrochloric acid (HCl).

In embodiments when the second etch chamber is a wet etch chamber, removing the dummy gate oxide material from the plurality of fins comprises one or more of: cleaning the substrate surface with a first chemistry including fluorine; cleaning the substrate surface with a second chemistry comprising liquid ammonium hydroxide or a strong base; or cleaning the substrate surface with a third chemistry comprising chlorine.

In embodiments where an immersion chamber (e.g., a batch chamber) is used, wafers may travel through the batch chamber by a "walking beam" mechanism. Without intending to be bound by any particular theory, the walking beam mechanism comprises a structure that is configured to lift a plurality of wafers and to then move the plurality of wafers together to the next desired location. In other embodiments where a batch chamber is used, a "pick and place" may be used allowing the batch immersion chamber to utilize chemical exposures that require multiples of the standard per-chamber throughput of the cluster tool. Stated differently, in embodiments where a batch immersion chamber is used, similar processes as those performed in a single-wafer chamber may be repeated in order to process a plurality of wafers.

In some embodiments, at least one of the first etch chamber, the second etch chamber, or the third etch chamber is a dry etch chamber.

In some embodiments, the first etch chamber is a dry etch chamber, the second etch chamber is a dry etch chamber, and the third etch chamber is a dry etch chamber. In some embodiments, the first etch chamber is a wet etch chamber, the second etch chamber is a dry etch chamber, and the third etch chamber is a dry etch chamber. In some embodiments, the first etch chamber is a wet etch chamber, the second etch chamber is a wet etch chamber, and the third etch chamber is a dry etch chamber.

Embodiments of the disclosure provide methods and apparatus that eliminates at least 1, 2, 3, 4 or 5 cleaning steps. In some embodiments, the substrate is not subjected to a cleaning process between removing the dummy gate polysilicon and removing the dummy gate oxide material. Some embodiments of the disclosure use 1, 2 or 3 cleaning steps between operations 502, 504, 506, in total. Some embodiments of the disclosure have one cleaning step before operation 502 and no further cleaning steps before operations 504, 506.

In some embodiments, operation 506 for removing the layers of second material between adjacent layers of the first material comprises cleaning the substrate surface.

Figure 5:
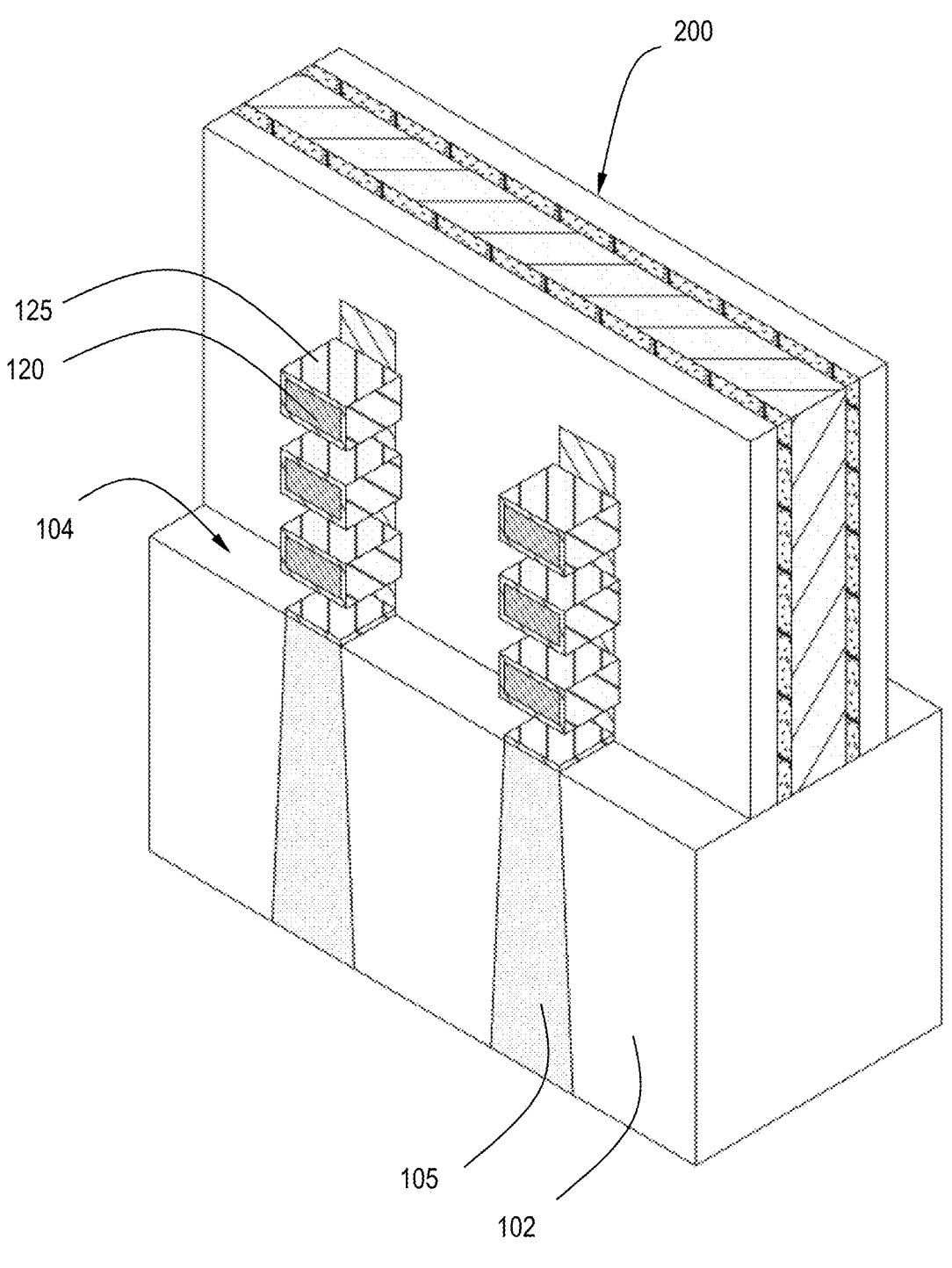
Figure 6:
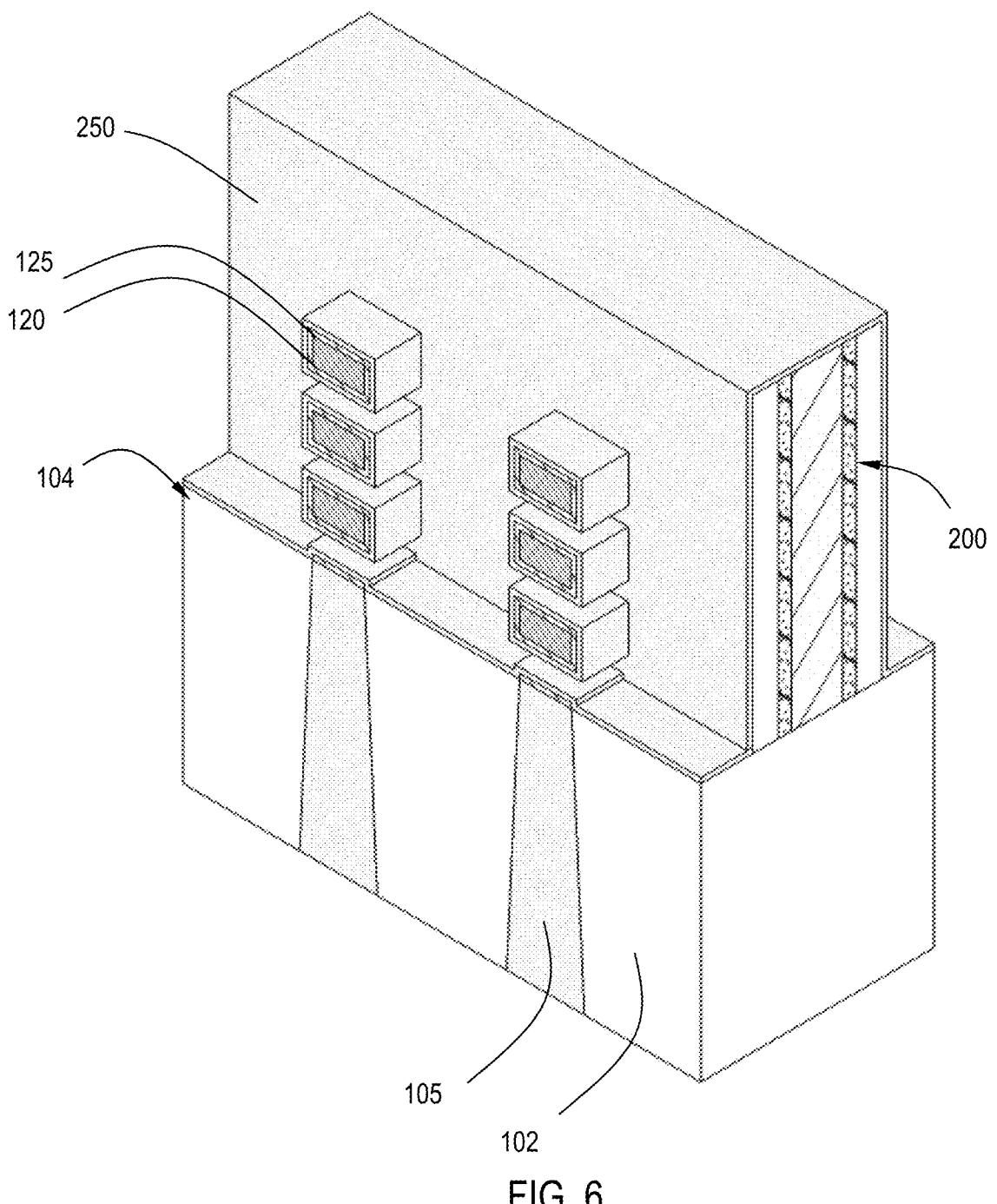
Figure 7:
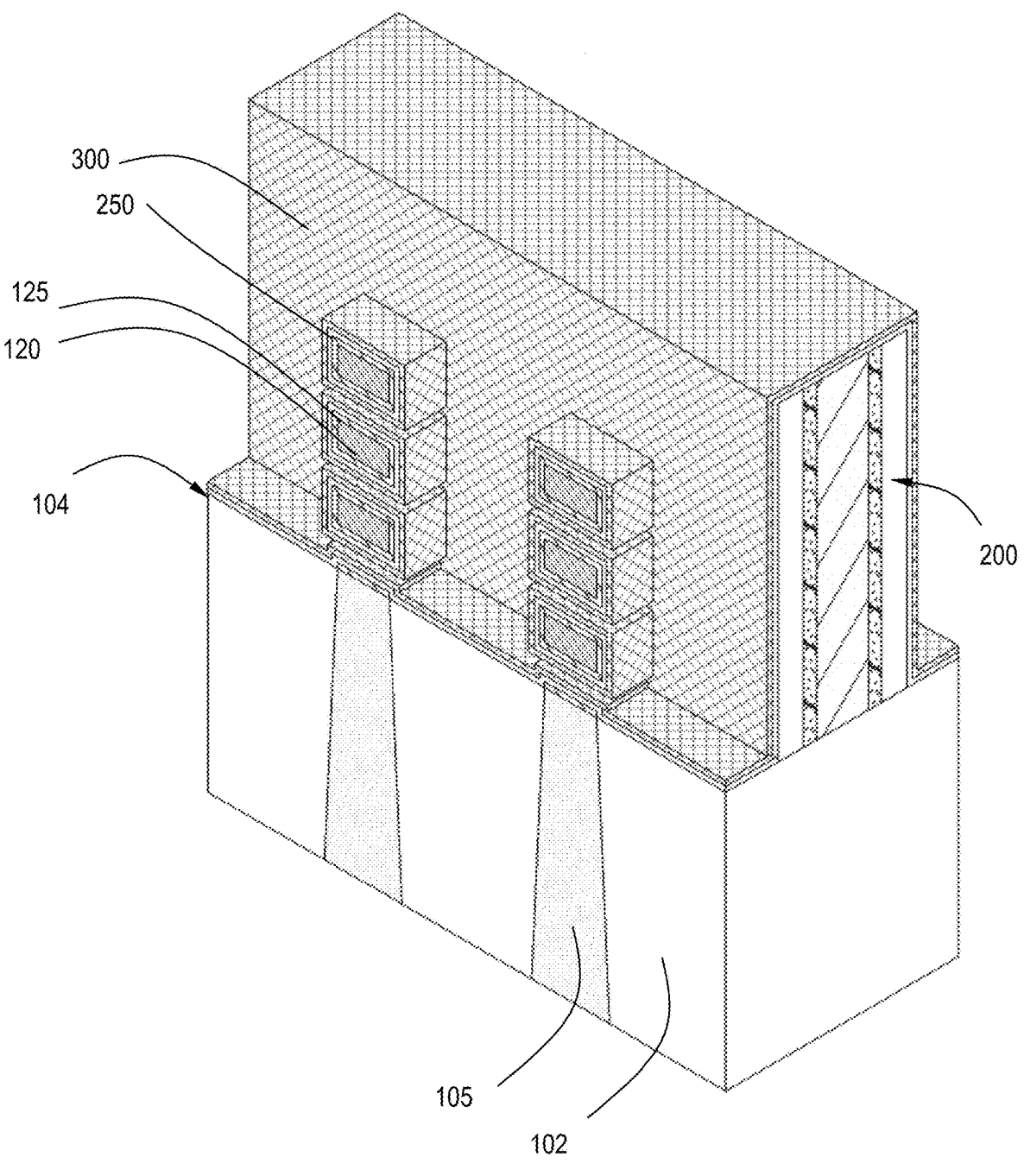

The processing method 500 optionally includes one or more of: forming a thin oxide layer 125 on each of the layers of first material 120 in a fourth processing chamber (operation 508) illustrated in FIG. 5; forming a high-κ metal oxide layer 250 on the thin oxide layer 125 in a fifth processing chamber (operation 510) illustrated in FIG. 6; or forming a metal nitride layer 300 on the high-κ metal oxide layer 250 in a sixth processing chamber (operation 512) illustrated in FIG. 7.

In some embodiments, at operation 508, the thin oxide layer 125 is deposited over each of the layers of first material 120. The thin oxide layer 125 may be deposited using a conventional chemical vapor deposition (CVD) method (e.g., plasma enhance chemical vapor deposition (PECVD) or low-pressure chemical vapor deposition (LPCVD)), or by a conventional atomic layer deposition (ALD) method (e.g., via a thermal or plasma enhanced process). In some embodiments, the thin oxide layer 125 may be formed by exposing each of the layers of first material 120 to ozone and water. In embodiments where each of the layers of first material 120 are exposed to ozone and water, the thin oxide layer 125 grows on and wraps around each of the layers of first material 120.

In one or more embodiments, thin oxide layer 125 is formed from any suitable dielectric material such as, but not limited to, undoped silicon oxide, doped silicon oxide, silicon nitride, and silicon oxynitride.

With respect to operation 510, the high-κ metal oxide layer 250 comprises any suitable high-κ metal oxide material known to the skilled artisan. In some embodiments, the high-κ metal oxide layer 250 comprises hafnium oxide (HfOx).

With respect to operation 512, the metal nitride layer 300 comprises any suitable metal nitride known to the skilled artisan. In some embodiments, the metal nitride layer 300 comprises titanium nitride (TiN).

The processing method 500 may be used in the cluster tool 400 illustrated in FIG. 8 to the semiconductor structures illustrated in FIGS. 2-4, including, for example, a GAA device structure.

The cluster tool 400 generally includes a factory interface 402, load lock chambers 404, 406, transfer chambers 408, 410 with respective transfer robots 412, 413, 414, holding chambers 416, 418, and plurality of processing chambers 420, 422, 424, 426, 428, 430, 484, 485. The transfer chambers 408, 410 (which may be referred to as "central transfer station(s)") are configured to receive a substrate and to transfer the substrate to and from the plurality of processing chambers 420, 422, 424, 426, 428, 430, 485, 485 by their respective transfer robots 413, 414. Each of the plurality of processing chambers 420, 422, 424, 426, 428, 430, are independently connected to the central transfer stations 408, 410, 487.

In some embodiments, transfer robot 412 is configured to move substrates between the factory interface 402, wet etch chamber 484 and load lock chamber 404, 406. The wet etch chamber 484 can be connected to a chemistry supply system 485. The placement of the transfer robot 412, wet etch chamber 484 and chemistry supply system 485 illustrated is merely an example of one possible configuration and should not be taken as limiting the scope of the disclosure. In some embodiments, the cluster tool includes a robot configured to move substrates between a vacuum environment and an atmospheric pressure wet environment, including use of a suitable load lock chamber between the vacuum and atmospheric environments. In some embodiments, the chambers 484, 485 are both wet etch chambers and the chemistry supply system is connected to one or both chambers.

As detailed herein, wafers in the cluster tool 400 can be processed in and transferred between the various chambers without exposing the wafers to an ambient environment exterior to the cluster tool 400 (e.g., an atmospheric ambient environment such as may be present in a fab). For example, the wafers can be processed in and transferred between the various chambers in a low pressure (e.g., less than or equal to about 300 Torr) or vacuum environment without breaking the low pressure or vacuum environment between various processes performed on the wafers in the cluster tool 400. In some embodiments, the low pressure or vacuum environment is broken when transferring the wafers from a load lock chamber to a wet etch chamber. Without intending to be bound by any particular theory, breaking the low pressure or vacuum environment transferring the wafers from a load lock chamber to a wet etch chamber is a well-controlled vacuum break that does not negatively impact the wafers that are processed. Accordingly, the cluster tool 400 may provide for an integrated solution for some processing of wafers.

In the illustrated example of FIG. 8, the factory interface 402 includes a docking station 440 and factory interface robots 442 to facilitate transfer of wafers. The docking station 440 is configured to accept one or more front opening unified pods (FOUPs) 444. In some examples, each factory interface robot 442 generally comprises a blade 448 disposed on one end of the respective factory interface robot 442 configured to transfer the wafers from the factory interface 402 to the load lock chambers 404, 406.

The load lock chambers 404, 406 have respective ports 450, 452 coupled to the factory interface 402 and respective ports 454, 456 coupled to the transfer chamber 408. The transfer chamber 408 further has respective ports 458, 460 coupled to the holding chambers 416, 418 and respective ports 462, 464 coupled to processing chambers 420, 422.

Similarly, the transfer chamber 410 has respective ports 466, 468 coupled to the holding chambers 416, 418 and respective ports 470, 472, 474, 476 coupled to processing chambers 424, 426, 428, 430. The ports 454, 456, 458, 460, 462, 464, 466, 468, 470, 472, 474, 476 can be, for example, slit valve openings with slit valves for passing wafers therethrough by the transfer robots 412, 413, 414 and for providing a seal between respective chambers to prevent a gas from passing between the respective chambers. Generally, any port is open for transferring a wafer therethrough. Otherwise, the port is closed.

The load lock chambers 404, 406, transfer chambers 408, 410, holding chambers 416, 418, and processing chambers 420, 422, 424, 426, 428, 430 may be fluidly coupled to a gas and pressure control system (not specifically illustrated). The gas and pressure control system can include one or more gas pumps (e.g., turbo pumps, cryo-pumps, roughing pumps), gas sources, various valves, and conduits fluidly coupled to the various chambers. In operation, a factory interface robot 142 transfers a wafer from a FOUP 444 through a port 450 or 452 to a load lock chamber 404 or 406. The gas and pressure control system then pumps down the load lock chamber 404 or 406. The gas and pressure control system further maintains the transfer chambers 408, 410 and holding chambers 416, 418 with an interior low pressure or vacuum environment (which may include an inert gas). Hence, the pumping down of the load lock chamber 404 or 406 facilitates passing the wafer between, for example, the atmospheric environment of the factory interface 402 and the low pressure or vacuum environment of the transfer chamber 408.

The transfer robot 412 is capable of transferring the wafer from the load lock chamber 404 or 406 into the transfer chamber 487 through the port 483 or 486. The transfer robot 412 is then capable of transferring the wafer to and/or between any of the processing chambers 484, 485 through the respective ports 483, 486 for processing and back to the docking station 440 for holding to await further transfer.

The transfer robot 413 is capable of transferring the wafer from the load lock chamber 404 or 406 into the transfer chamber 408 through the port 454 or 456. The transfer robot 413 is then capable of transferring the wafer to and/or between any of the processing chambers 420, 422 through the respective ports 462, 464 for processing and the holding chambers 416, 418 through the respective ports 458, 460 for holding to await further transfer. Similarly, the transfer robot 414 is capable of accessing the wafer in the holding chamber 416 or 418 through the port 466 or 468 and is capable of transferring the wafer to and/or between any of the processing chambers 424, 426, 428, 430 through the respective ports 470, 472, 474, 476 for processing and the holding chambers 416, 418 through the respective ports 466, 468 for holding to await further transfer. The transfer and holding of the wafer within and among the various chambers can be in the low pressure or vacuum environment provided by the gas and pressure control system.

Embodiments of the present disclosure advantageously provide an integrated cluster tool 400 that reduces the number of cleaning steps. Stated differently, the integrated cluster tool 400 advantageously avoids steps that are present in conventional cluster tools, including but not limited to: sequentially removing the wafers from the processing tools, loading the wafers into a FOUP, using an OverHead Track (OHT) system to move the FOUP to a Stocker (stores the FOUP), using an OHT to move the FOUP back to the next processing tool, loading the wafers into the processing tool, and then resuming the process (i.e., remove-load-movemove back-reload sequence). In each step of the remove-load-move-move back-reload sequence performed in conventional cluster tools, variation in the sidewall material is induced. Without intending to be bound by any particular theory of operation, it is believed that variation in sidewall loss is induced by each of subsequent cleaning step and each of subsequent etch step. One or more of a subsequent cleaning step or an etching step is performed after each step in a conventional remove-load-move-move back-reload sequence. The skilled artisan will recognize that variation in sidewall loss negatively impacts semiconductor device performance.

In particular embodiments, because the steps of a remove-load-move-move back-reload sequence are not included in the integrated cluster tool 400, some steps that may introduce variation in sidewall material are avoided. In specific embodiments, there are in a range of from 1 to 5 fewer cleaning steps in the integrated cluster tool 400 compared to a conventional cluster tool implementing the steps of a remove-load-move-move back-reload sequence.

In specific embodiments, there are at least 4 fewer cleaning steps, including at least 3 fewer cleaning steps, at least 2 fewer cleaning steps, or at least 1 fewer cleaning step in the integrated cluster tool 400 compared to a conventional cluster tool implementing the steps of a remove-load-move-move back-reload sequence.

The integrated cluster tool 400 advantageously reduces the absolute value of the sidewall loss and the variation in sidewall loss. Without intending to be bound by any particular theory, fewer precleans required results in a reduced amount of compensatory deposition for the sidewall thickness, and, as a result of fewer precleans introducing variation in sidewall loss, there is less variation in sidewall loss in the integrated cluster tool 400. The integrated cluster tool 400 advantageously reduces the total time between cleaning and processing operations, as well as variations in time between processing.

In one or more specific embodiments, the integrated cluster tool 400 reduces spacer material loss in the gate-all-around (GAA) device compared to conventional processing chambers and cluster tools. In some embodiments wherein one or more of the first etch chamber or the second etch chamber is a wet etch chamber and the third etch chamber is a dry etch chamber, the integrated cluster tool 400 reduces variation in sidewall loss in a deposited film on a semiconductor device (e.g., a GAA device) compared to other cluster tools.

The processing chambers 420, 422, 424, 426, 428, 430 can be any appropriate chamber for processing a wafer. In some embodiments, the processing chamber 420 is a first etch chamber configured to remove a dummy gate polysilicon layer from a top surface of a plurality of dummy gates. In some embodiments, the processing chamber 422 is a second etch chamber configured to remove a dummy gate oxide material deposited on the plurality of fins. In some embodiments, the processing chamber 424 is a third etch chamber configured to remove the layers of second material deposited on the plurality of fins.

The processing chambers 426, 428, 430 may be a fourth processing chamber configured to form a thin oxide layer on each of the layers of first material, a fifth processing chamber configured to deposit a high-κ metal oxide layer on the thin oxide layer, or a sixth processing chamber configured to deposit a metal nitride layer on the high-κ metal oxide layer, respectively.

A system controller 490 is coupled to the cluster tool 400 for controlling the cluster tool 400 or components thereof.

For example, the system controller 490 may control the operation of the cluster tool 400 using a direct control of the chambers 404, 406, 408, 416, 418, 410, 420, 422, 424, 426, 428, 430 of the cluster tool 400 or by controlling controllers associated with the chambers 404, 406, 408, 416, 418, 410, 420, 422, 424, 426, 428, 430. In operation, the system controller 490 enables data collection and feedback from the respective chambers to coordinate performance of the cluster tool 400.

The system controller 490 generally includes a central processing unit (CPU) 492, memory 494, and support circuits 496. The CPU 492 may be one of any form of a general-purpose processor that can be used in an industrial setting. The memory 494, or non-transitory computer-readable medium, is accessible by the CPU 492 and may be one or more of memory such as random-access memory (RAM), read only memory (ROM), floppy disk, hard disk, or any other form of digital storage, local or remote. The support circuits 496 are coupled to the CPU 492 and may comprise cache, clock circuits, input/output subsystems, power supplies, and the like. The various methods disclosed herein may generally be implemented under the control of the CPU 492 by the CPU 492 executing computer instruction code stored in the memory 494 (or in memory of a particular process chamber) as, for example, a software routine. When the computer instruction code is executed by the CPU 492, the CPU 492 controls the chambers to perform processes in accordance with the various methods.

In some embodiments, the system controller 490 is configured to perform a cleaning process prior to the steps of: removing the dummy gate polysilicon layer from the top surface of the plurality of dummy gates in the first etch chamber; removing the dummy gate oxide material deposited on the plurality of fins in the second etch chamber; and removing the layers of second material between adjacent layers of the first material in the third etch chamber.

Other processing systems can be in other configurations. For example, more or fewer processing chambers may be coupled to a transfer apparatus. In the illustrated example, the transfer apparatus includes the transfer chambers 408, 410 and the holding chambers 416, 418. In other examples, more or fewer transfer chambers (e.g., one transfer chamber) and/or more or fewer holding chambers (e.g., no holding chambers) may be implemented as a transfer apparatus in a processing system.

The processing method 500 optionally includes one or more of: forming a thin oxide layer on each of the layers of first material in a fourth processing (operation 508); forming a high-κ metal oxide layer on the thin oxide layer in a fifth processing chamber (operation 510); or forming a metal nitride layer on the high-κ metal oxide layer in a sixth processing chamber (operation 512). The optional operations 508, 510, 512 may be performed in one or more of the processing chambers 426, 428, 430.

One or more embodiments are directed to a non-transitory computer readable medium including instructions, that, when executed by the system controller 490 of a cluster tool 400, cause the cluster tool 400 to perform the operations of processing method 500. In some embodiments, the system controller 490 causes the cluster tool 400 to perform the operations of removing the dummy gate polysilicon layer from the top surface of the plurality of dummy gates in the first etch chamber (operation 502), removing the dummy gate oxide material deposited on the plurality of fins in the second etch chamber (operation 504) and removing the layers of second material between adjacent layers of the first material in the third etch chamber (operation 506), and, optionally, one or more of: forming the thin oxide layer on each of the layers of first material in the fourth processing (operation 508); forming the high-κ metal oxide layer on the thin oxide layer in the fifth processing chamber (operation 510); or forming the metal nitride layer on the high-κ metal oxide layer in the sixth processing chamber (operation 512).

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" may encompass both an orientation of above and below. The device may be otherwise oriented (rotated 90 degrees or at other orientations) and the spatially relative descriptors used herein interpreted accordingly.

Reference throughout this specification to "one embodiment," "certain embodiments," "one or more embodiments" or "an embodiment" means that a particular feature, structure, material, or characteristic described in connection with the embodiment is included in at least one embodiment of the disclosure. Thus, the appearances of the phrases such as "in one or more embodiments," "in certain embodiments," "in one embodiment" or "in an embodiment" in various places throughout this specification are not necessarily referring to the same embodiment of the disclosure. Furthermore, the particular features, structures, materials, or characteristics may be combined in any suitable manner in one or more embodiments.

Although the disclosure herein has been described with reference to particular embodiments, those skilled in the art will understand that the embodiments described are merely illustrative of the principles and applications of the present disclosure. It will be apparent to those skilled in the art that various modifications and variations can be made to the method and apparatus of the present disclosure without departing from the spirit and scope of the disclosure. Thus, the present disclosure can include modifications and variations that are within the scope of the appended claims and their equivalents.

What is claimed is:

1. A processing method for forming a gate-all-around (GAA) device, comprising:
   removing a dummy gate polysilicon layer from a dummy gate oxide layer in a first etch chamber, wherein the dummy gate oxide layer is disposed on a fin on the substrate, wherein the fin comprises alternating layers of a first material and a second material, wherein the first material is different than the second material;
   removing the dummy gate oxide layer in a second etch chamber; and
   removing the layers of the second material in a third etch chamber to expose a spacer material, wherein the first etch chamber, the second etch chamber, and the third etch chamber are in a cluster tool,
   wherein there is an absence of a cleaning step between removing the dummy gate polysilicon layer and removing the dummy gate oxide layer, and between removing the dummy gate oxide layer and removing the layers of the second material, and wherein an absolute value of the spacer material loss and a variation in spacer material loss is reduced compared to a processing method including a cleaning step.

2. The processing method of claim 1, wherein the first material comprises silicon or silicon germanium and wherein the second material comprise silicon or silicon germanium.

3. The processing method of claim 1, wherein each of the first etch chamber and second etch chamber independently comprises a single-wafer chamber or an immersion chamber.

4. The processing method of claim 3, wherein one or more of the first etch chamber or the second etch chamber is a wet etch chamber.

5. The processing method of claim 4, wherein one or more of the first etch chamber or the second etch chamber comprises a plurality of stacked single-wafer wet etch chambers.

6. The processing method of claim 1, wherein at least one of the first etch chamber, the second etch chamber, and the third etch chamber is a dry etch chamber.

7. The processing method of claim 1, further comprising one or more of:

forming a thin oxide layer on each of the layers of the first material in a fourth processing chamber;

forming a high-K metal oxide layer on the thin oxide layer in a fifth processing chamber; or forming a metal nitride layer on the high-K metal oxide layer in a sixth processing chamber.

8. The processing method of claim 7, wherein the thin oxide layer is deposited directly on the first material, formed directly on the first material by exposing the first material to ozone ($O_3$) and water ($H_2O$), or formed directly on the first material from a dielectric material.

* * * * *